United States Patent [19]

Sato et al.

[11] Patent Number: 4,883,702

[45] Date of Patent: Nov. 28, 1989

[54] POLYPHENYLENE SULFIDE RESIN COMPOSITION USEFUL FOR PLATING

[75] Inventors: Masatoshi Sato; Kensuke Ogawara; Noriaki Emura, all of Yamaguchi, Japan

[73] Assignees: Tosoh Corporation, Yamaguchi; Hodogaya Chemical Co., Ltd., Tokyo, both of Japan

[21] Appl. No.: 198,657

[22] Filed: May 23, 1988

Related U.S. Application Data

[63] Continuation of Ser. No. 941,120, Dec. 12, 1986, abandoned.

[30] Foreign Application Priority Data

Dec. 12, 1985 [JP] Japan ................................. 60-277914

[51] Int. Cl.$^4$ ........................... C08K 3/40; C08K 3/10
[52] U.S. Cl. ..................................... 428/141; 428/419; 524/413; 524/609
[58] Field of Search ............... 428/141, 419; 524/413, 524/609

[56] References Cited

U.S. PATENT DOCUMENTS

| | | | |
|---|---|---|---|
| 4,365,037 | 12/1982 | Adachi et al. | 524/609 |
| 4,487,879 | 12/1984 | Needham | 524/609 |
| 4,495,253 | 1/1985 | Abel | 428/419 |
| 4,529,769 | 7/1985 | Johnson et al. | 524/413 |
| 4,785,057 | 11/1988 | Shiiki et al. | 525/535 |
| 4,795,671 | 1/1989 | Shiiki et al. | 428/419 |

FOREIGN PATENT DOCUMENTS

| | | | |
|---|---|---|---|
| 0196122 | 12/1983 | European Pat. Off. | |
| 152051 | 9/1983 | Japan | 524/413 |
| 215353 | 12/1984 | Japan | 524/413 |
| 2156353 | 12/1984 | Japan | 524/413 |
| 5101517 | 4/1985 | Japan | . |
| 5890361 | 4/1985 | Japan | . |
| 147471 | 8/1985 | Japan | 524/413 |

OTHER PUBLICATIONS

Derwent Publications Ltd., World Patent Index, 25/1985, Accession No. 85-150 272-25/JP-A-60-08-3-519, "Light Weight Fishing Reel of Excellent Dimensional Strength . . . Fiber".

*Primary Examiner*—John C. Bleutge
*Assistant Examiner*—David W. Woodward
*Attorney, Agent, or Firm*—Sughrue, Mion, Zinn, Macpeak & Seas

[57] ABSTRACT

A polyphenylene sulfide composition useful for plating is disclosed, comprising a polyphenylene sulfide resin, glass fibers, and potassium titanate fibers. Molded articles of this composition, when plated after etching, provide a plated article which is excellent in appearance and peel strength. Thus these plated articles can be used in outer applications, such as electric parts and automobile parts.

4 Claims, No Drawings

POLYPHENYLENE SULFIDE RESIN COMPOSITION USEFUL FOR PLATING

This is a continuation of Ser. No. 941,120 filed 12/12/86, now abandoned.

FIELD OF THE INVENTION

The present invention relates to a polyphenylene sulfide resin (hereinafter referred to as a "PPS resin") composition useful for plating, which is excellent in peel strength and also in appearance.

BACKGROUND OF THE INVENTION

PPS resins are excellent in heat resistance, mechanical properties, and chemical resistance, and thus are used, for example, in the fabrication of parts for electric equipment and automobiles, utilizing the above excellent characteristics. Further, since the plating processing which was hitherto considered to be difficult because of excessively high chemical resistance of the PPS resins has become possible, the PPS resins can also be effectively applied for reflector plates, printed circuit boards, electromagnetic shields, sheathed parts, etc.

As such PPS resin compositions for plating, a PPS resin and glass fiber composition as described in Japanese Pat. Application (OPI) No. 54290/84 (the term "OPI" as used herein means a "published unexamined patent application") and a PPS resin, glass fiber, and calcium carbonate composition as described also in Japanese Pat. Application (OPI) No. 54290/84 are under investigation. These compositions, however, have disadvantages in that the initial plate peel strength is low and post-treatment such as aging for a long time is needed, and thus are somewhat unsuitable for practical use.

Furthermore, since PPS resins are excellent in chemical resistance, there is available no suitable etching solution to be used as a plating pre-processing solution at the etching step and, therefore, a plated article excellent in adhesion properties has not yet been obtained.

It has therefore been desired to develop, as well as an etching solution for PPS resins, PPS resin compositions which permit the fabrication of plated articles having excellent plate adhesion properties and also having good surface luster.

SUMMARY OF THE INVENTION

As a result of extensive investigations to overcome the above problems and to develop a PPS resin composition which is excellent in both plate peel strength and appearance, it has been found that when a PPS resin composition containing glass fibers and potassium titanate fibers is subjected to surface treatment, even using a strongly acidic etching solution, a PPS resin composition which is excellent in both peel strength and appearance can be obtained.

Thus, the present invention provides a PPS resin composition useful for plating, comprising a PPS resin, glass fibers, and potassium titanate fibers. The composition has good adhesion properties.

DETAILED DESCRIPTION OF THE INVENTION

In the PPS resin as used in the present invention, other components may be copolymerized as long as the resin contains at least 70 mol %, and preferably at least 90 mol % of a repeating unit represented by formula

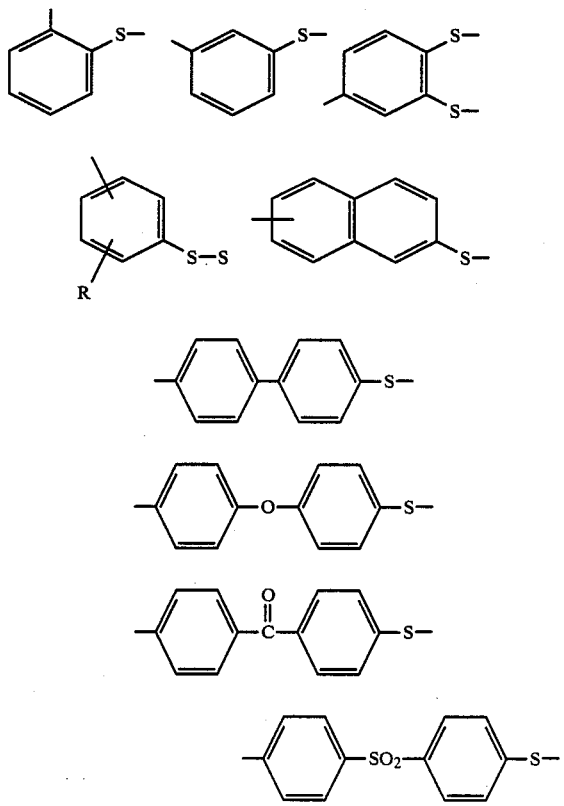

The viscosity is not critical. In the above copolymerization case, as the other components, the following examples can be listed.

In the foregoing, R represents an alkyl group, a phenyl group, a nitro group, a carboxyl group, a nitrile group, an amino group, an alkoxyl group, a hydroxyl group, or a sulfone group.

The PPS resin as used herein is reinforced with glass fibers. The PPS resin content is from 30 to 70 wt %, and the glass fiber content is from 70 to 30 wt %. In addition, the PPS resin as used herein may contain a thermal degradation-inhibiting agent, a nucleating agent, a releasing agent, and the like.

The potassium titanate fibers as used herein are preferably short fibers having an average fiber diameter of not more than 1 micron, an average fiber length of from 5 to 100 microns and an aspect ratio of at least than 10 (i.e., 10/1). The potassium titanate fiber content is from 1 to 10 wt %. If the potassium titanate fiber content is less than 1 wt %, the plate peel strength tends to be low and the appearance of the plated article tends to be poor. On the other hand, if the potassium titanate fiber content is in excess of 10 wt %, the mechanical properties of the resin composition tends to be reduced, and furthermore the plate peel strength tends to be decreased.

By compounding potassium titanate fibers to a composition comprising the PPS resin and glass fibers according to the present invention, a plated article of the PPS resin composition can be obtained, which has unexpectedly excellent plate adhesion properties and appearance, without seriously reducing its mechanical properties. The reason for this is thought to be that the PPS resin layer is corroded by a strongly acidic etching solution and the potassium titanate fibers themselves present in the vicinity of the surface are partly dissolved. This leads to formation of irregularities greatly contributing to the plate adhesion properties on the surface layer of the molded article, as a result of which there can be obtained excellent plate peel strength.

In etching of the PPS resin composition of the present invention, a mixed solution of a chromic acid compound, sulfuric acid, and phosphoric acid is used as an etching solution. In a case where higher plate peel strength is needed, surface abrasion, for example, by sand blasting, is applied before the etching treatment, or a mixed solution of a hydrofluoric acid salt, a mineral acid, and hydrofluoric acid is used as an etching solution. The treatment temperature is in a range of from room temperature to about 70° C., and the treatment time is in a range of from about 1 to 30 minutes. After etching, chemical plating and subsequently electroplating which are conventionally employed for plating are applied, whereupon there can be obtained a plated molded article. The above chemical plating step comprises sensitization, activation, and chemical plating. The sensitization is a step wherein a reducing metal salt, such as stannous chloride, is adsorbed on the surface of the molded article. The activation is a step wherein a metal having a catalytic activity, such as palladium, gold, silver, or rhodium is adsorbed, and the noble metal is deposited and absorbed from the treatment solution by the action of the reducing substance used at the preceding step. Onto the molded article thus treated, chemical plating such as chemical copper plating and chemical nickel plating is applied. This chemical plating is applied to impart electroconductivity to the molded article. As a result of the chemical plating, therefore, suitable electroplating can be subsequently applied.

Using a molded article of the PPS resin composition of the present invention, comprising the PPS resin, glass fibers, and potassium titanate fibers, there can be obtained a plated article excellent in peel strength and appearance, without causing a serious reduction in mechanical properties. Thus the PPS resin composition of the present invention is useful in production of electric parts to be used for outer equipment parts, automobile parts, exterior surfaces, printed circut boards, molded plates having electroconductivity, and boxes having complex structures.

The present invention is described in greater detail with reference to the following examples, although the invention is not intended to be limited thereto. The characteristics values in the examples were measured by the following methods.

(1) Peel Strength

Parallel lines were cut in the plated surface at 1 cm intervals. The cut plated layer was pulled in a direction vertical to the line cut direction at 20 mm/min, and the force (minimum value) needed therefor was measured.

(2) Appearance

The test surface was visually examined for smoothness at a distance of 60 cm under a light source of at least 150 lux. The rating was as follows:

a: Excellent
b: Good
c: Bad (3) Flexural Strength

An injection molded article (½ in.×5 in.×⅛ in. before plating was measured for breaking strength by bending at a rate of 1.5 mm/min according to ASTM D-790.

EXAMPLE 1

A resin composition of 50 wt % of a PPS resin (trade name: Ryton ® P-4; produced Phillips Petroleum Co.), 45 wt % of glass fibers (chopped strand having a fiber diameter of 13 μm and a cut length of 3 mm), plus and 5 wt % (based on the total weight of the first two components, as previously noted) of potassium titanate fibers (high-strength short crystal whiskers produced by Otsuka Chemical Co., Ltd.; trade name: Tismo D (average fiber diameter: 0.2 to 0.5 micron; average fiber length: 10 to 20 microns; aspect ratio: 20 to 100)) was injection molded using a molding apparatus, Sumitomo Netstal PROMAT 165/75 (mold clamping force: 75 tonf. (metric), injection volume (max): 68 cm$^3$), to produce a plate. This plate was used as a sample.

This sample was previously degreased by washing in a neutral detergent heated to 60° C. for 10 minutes.

The previously degreased sample was soaked for 30 minutes in a mixed solution of 10 wt % of potassium dichromate, 35 wt % of sulfuric acid, and 10 wt % of phosphoric acid maintained at 60° C. to perform etching and, thereafter, the sample was washed with water. Then the above etched sample was soaked at room temperature for 10 minutes in a mixed solution of 150 ml/liter of Catalyst A-30 (produced by Okuno Seiyaku Kogyo K.K.) and 150 ml/liter of hydrochloric acid to perform sensitization. After washing with water, the sample was soaked in a 8 ml/liter solution of sulfuric acid for 3 minutes, and then washed with water. Then the sample was soaked in a mixed solution of 100 ml/liter of a chemical copper plating solution #100A and 100 ml/liter of #100B (both produced by Okuno Seiyaku Kogyo K.K.) at room temperature for 20 minutes to perform chemical copper plating.

In a mixed solution of 220 g of copper sulfate, 34 ml of sulfuric acid, 6 ml of a gloss agent, and 1,000 ml of water with the above chemical copper-plated molded article as a cathode and a copper plate as an anode, 4 A/dm$^2$ of current was passed to perform electric copper plating at room temperature for 120 minutes. The plated molded article thus obtained was evaluated for appearance and peel strength. The results are shown in Table 1 along with the flexural strength of the molded article before plating.

EXAMPLE 2

In addition, a sample was produced in the same manner as in Example 1, except that surface abrasion using a sand paper #400 was applied before degreasing and washing. This sample was subjected to plating pretreatment and plating in the same manner as in Example 1. The results of evaluation of the plated molded article are shown in Table 1.

EXAMPLE 3

A sample was produced in the same manner as in Example 1, except that the etching treatment after the degreasing treatment was conducted by soaking in a mixed solution of 20 wt % of ammonium hydrogenfluoride, 70 wt % of nitric acid, and 10 wt % of hydrofluoric acid at 40° C. for 10 minutes. This sample was plated under the same plating conditions as in Example 1. The results of evaluation of the plated molded article thus obtained are shown in Table 1.

EXAMPLE 4

Plating pre-treatment and plating were performed in the same manner as in Example 3, except that the potassium titanate fiber content was changed to 10 wt % and that the glass fiber content was changed to 40 wt %. The results of evaluation of the plated molded article thus obtained are shown in Table 1.

COMPARATIVE EXAMPLE 1

A plate was produced in the same manner as in Example 2, except that a PPS resin composition containing only 50 wt % of glass fibers was used. This plate was subjected to the same plating pre-treatment and plating in the same manner as in Example 2. The results of evaluation of the plated molded article are shown in Table 1.

COMPARATIVE EXAMPLE 2

Using a composition containing 50 wt % of a PPS resin and 50 wt % of glass fibers, the plating was carried out in the same manner as in Example 3. The results of evaluation are shown in Table 1.

COMPARATIVE EXAMPLE 3

Using a composition containing 70 wt % of a PPS resin and 30 wt % of potassium titanate fibers, the plating was carried out in the same manner as in Example 3. The results of evaluation are shown in Table 1.

COMPARATIVE EXAMPLE 4

The same procedures as in Example 3 were repeated except that the glass fiber content was changed to 20 wt % and that the potassium titanate fiber content was changed to 30 wt %. The results of evaluation are shown in Table 1.

COMPARATIVE EXAMPLES 5 AND 6

The same procedures as in Example 3 were repeated except that the potassium titanate fibers were changed to 5 wt % of calcium carbonate (in Comparative Example 5) or 5 wt % of talc (in Comparative Example 6). The results of evaluation are shown in Table 1.

TABLE 1

| | PPS Resin (Ryton P-4) (wt %) | Glass Fibers (wt %) | Potassium Titanate Fibers (wt %) | Calcium Carbonate (wt %) | Talc (wt %) | Etching Treatment* | Flexural Strength (MPa) | Performance of Plated Molded Article Appearance | Peel Strength (kgf/cm) |
|---|---|---|---|---|---|---|---|---|---|
| Example 1 | 50 | 45 | 5 | — | — | A | 220 | b | 0.7 |
| Example 2 | 50 | 45 | 5 | — | — | A | 220 | b | 1.2 |
| Example 3 | 50 | 45 | 5 | — | — | B | 220 | a | 1.8 |
| Example 4 | 50 | 40 | 10 | — | — | B | 190 | a | 1.6 |
| Comparative Example 1 | 50 | 50 | — | — | — | A | 230 | c | 0.4 |
| Comparative Example 2 | 50 | 50 | — | — | — | B | 230 | c | 0.8 |
| Comparative Example 3 | 70 | — | 30 | — | — | B | 170 | b | 0.3 |
| Comparative Example 4 | 50 | 20 | 30 | — | — | B | 180 | b | 0.4 |
| Comparative Example 5 | 50 | 45 | — | 5 | — | B | 160 | b | 0.9 |
| Comparative Example 6 | 50 | 45 | — | — | 5 | B | 160 | b | 0.8 |

*"A" means the etching treatment with a potassium dichromate/sulfuric acid mixture, and "B" means the etching treatment with an ammonium hydrogen-fluoride/nitric acid/hydrofluoric acid mixture.

As shown by the Examples in Table 1, incorporation of potassium titanate fibers into a resin composition comprising a PPS resin and glass fibers permits the production of a plated molded article of the PPS resin composition which is excellent in appearance and peel strength, without causing a serious reduction in the mechanical properties. This plated molded article is sufficiently satisfactory for practical use.

While the invention has been described in detail and with reference to specific embodiments thereof, it will be apparent to one skilled in the art that various changes and modifications can be made therein without departing from the spirit and scope thereof.

What is claimed:

1. An article comprised of a polyphenylene sufide resin composition comprising 30 to 70% by weight of a polyphenylene sulfide resin, from 70 to 30% by weight of glass fibers, and from 1 to 10% by weight of potassium titanate fibers, the surface of said article having been etched by an etching solution.

2. An article as in claim 1, wherein the polyphenylene sulfide resin contains at least 70 mol % of a repeating unit represented by formula

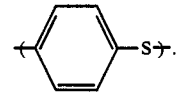

3. An article as in claim 2, wherein the polyphenylene sulfide resin contains at least 90 mol % of a repeating unit represented by formula

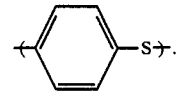

4. An article as in claim 1, wherein the potassium titanate fibers have an average fiber diameter of not more than 1 micron, an average fiber length of from 5 to 100 microns, and an aspect ratio of at least 10.

* * * * *